United States Patent
Chiu et al.

(10) Patent No.: US 9,508,656 B2
(45) Date of Patent: Nov. 29, 2016

(54) PACKAGE STRUCTURE AND METHOD FOR FABRICATING THE SAME

(71) Applicant: Siliconware Precision Industries Co., Ltd., Taichung (TW)

(72) Inventors: Chih-Hsien Chiu, Taichung (TW); Hsin-Lung Chung, Taichung (TW); Cho-Hsin Chang, Taichung (TW); Chia-Yang Chen, Taichung (TW); Chao-Ya Yang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/463,999

(22) Filed: Aug. 20, 2014

(65) Prior Publication Data

US 2016/0027740 A1 Jan. 28, 2016

(30) Foreign Application Priority Data

Jul. 25, 2014 (TW) ............................. 103125448 A

(51) Int. Cl.
*H01L 23/552* (2006.01)
*H05K 3/30* (2006.01)
*H01L 21/78* (2006.01)
*H01L 23/31* (2006.01)
*H01L 21/56* (2006.01)
*H01L 23/00* (2006.01)
*H01L 25/065* (2006.01)

(52) U.S. Cl.
CPC .......... *H01L 23/552* (2013.01); *H01L 21/561* (2013.01); *H01L 21/78* (2013.01); *H01L 23/3128* (2013.01); *H01L 23/3135* (2013.01); *H01L 24/97* (2013.01); *H01L 24/13* (2013.01); *H01L 24/16* (2013.01); *H01L 24/48* (2013.01); *H01L 25/0655* (2013.01); *H01L 2224/131* (2013.01); *H01L 2224/16227* (2013.01); *H01L 2224/48091* (2013.01); *H01L 2224/48227* (2013.01); *H01L 2224/97* (2013.01); *H01L 2924/1421* (2013.01); *H01L 2924/15159* (2013.01); *H01L 2924/15311* (2013.01); *H01L 2924/1815* (2013.01)

(58) Field of Classification Search
None
See application file for complete search history.

(56) References Cited

U.S. PATENT DOCUMENTS

| | | | | |
|---|---|---|---|---|
| 5,639,989 A * | 6/1997 | Higgins, III | .......... | H01L 23/552 174/386 |
| 2011/0006408 A1* | 1/2011 | Liao | .............................. | 257/660 |
| 2011/0198737 A1* | 8/2011 | Yao | ....................... | H01L 21/561 257/659 |
| 2013/0032385 A1* | 2/2013 | Lin et al. | ....................... | 174/260 |

* cited by examiner

*Primary Examiner* — Pamela E Perkins
(74) *Attorney, Agent, or Firm* — Mintz Levin Cohn Ferris Glovsky and Popeo, P.C.; Peter F. Corless; Steven M. Jensen

(57) ABSTRACT

A package structure includes a carrier, an electronic component disposed on the carrier, an encapsulant formed on the carrier for encapsulating the electronic component, a first shielding layer formed on the encapsulant, and a second shielding layer formed on the first shielding layer. The first and second shielding layers are made of different materials. With the multiple shielding layers formed on the encapsulating layer, the electronic component is protected from electromagnetic interferences. The present invention also provides a method for fabricating the package structure.

8 Claims, 5 Drawing Sheets

PACKAGE STRUCTURE AND METHOD FOR FABRICATING THE SAME

CROSS-REFERENCES TO RELATED APPLICATIONS

This application claims under 35 U.S.C. §119(a) the benefit of Taiwanese Application No. 103125448, filed Jul. 25, 2014, the entire contents of which is incorporated herein by reference.

BACKGROUND OF THE INVENTION

1. Field of the Invention

The present invention relates to package structures, and, more particularly, to a package structure that is protected from electromagnetic interferences and a method for fabricating the same.

2. Description of Related Art

With the rapid growth in electronic industry, most electronic products have been developed towards the goal for miniaturization and high speed, particularly as the modern communication techniques have been widely incorporated in various electronic products. However, as the electronic products include high frequency chips, and these chips are easily affected by electromagnetic interferences (EMI) due to the adjacent integrated circuits and digital signal processors (DSP), an electromagnetic shielding treatment is often required.

A conventional radio frequency (RF) module 1 that is protected from EMI is illustrated in FIGS. 1A to 1C. A plurality of RF chips 11a and 11b and non-RF electronic components 11 are electrically connected and incorporated on a packaging substrate 10. The RF chips 11a and 11b and the non-RF electronic components 11 are encapsulated by an encapsulating layer 13 such as epoxy resin. A thin metal film 14 is formed on the encapsulating layer 13. The RF chips 11a and 11b, the non-RF electronic components 11 and the packaging substrate 10 in the RF module 1 can be prevented from damages caused by outside moist or contaminants by the encapsulating layer 13, and the RF chip 11a and 11b are protected from EMI via the thin metal film 14.

Although the periphery of the RF module 1 is encapsulated by the thin metal film 14 and protected from EMI, if the RF chips 11a and 11b are low frequency components, it is difficult for the single thin metal film 14 to protect the RF module 1 from EMI efficiently.

Therefore, there is an urgent need for overcoming the drawbacks of the prior art.

SUMMARY OF THE INVENTION

In view of the foregoing problems, the present invention provides a package structure, comprising: a carrier; at least one electronic component disposed on the carrier; an encapsulant formed on the carrier for encapsulating the electronic components; a first shielding layer formed on the encapsulant; and at least one second shielding layer formed on the first shielding layer, wherein the first shielding layer and the at least one second shielding layer are made of different materials.

The present invention further provides a method for fabricating a package structure, comprising: providing a package body that has a carrier, at least one electronic component disposed on the carrier, and an encapsulant formed on the carrier for encapsulating the electronic components; forming a first shielding layer on the encapsulant; and forming at least one second shielding layer on the first shielding layer, wherein the first shielding layer and the at least one second shielding layer are made of different materials.

In an embodiment, the package body has a plurality of the electronic components, and is defined with a plurality of package units, each of which has one of the electronic components. In another embodiment, the method further comprises forming a plurality of trenches among the package units; forming the first shielding layer on the encapsulant and in the trenches; performing a singulation process along the trenches for separating the package units, with the first shielding layer remained on the package units; and forming the second shielding layer on the first shielding layer.

In an embodiment, the electronic component is an RF chip, the first shielding layer is made of an insulative material or a conductive material, and the second shielding layer is made of a conductive material.

In an embodiment, the trenches penetrate the encapsulating layer, or the trenches extend into the carrier. In another embodiment, the first shielding layer is formed along surfaces of the trenches, or the trenches are filled with the first shielding layer. In yet another embodiment, the first shielding layer is further formed on the carrier, the carrier has a step-like periphery that is covered by the first shielding layer, the first shielding layer has a step-like portion corresponding to the step-like periphery, and the side surface of the first shielding layer is flush the side surface of the carrier.

In summary, a package structure and a method for fabricating the same according to the present invention feature in forming on the encapsulant a plurality of shielding layers, including the first and second shielding layers, for improving the shielding effect, thereby protecting the electronic components from external electromagnetic interferences.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The present invention is described in the following with specific embodiments, so that one skilled in the pertinent art can easily understand other advantages and effects of the present invention from the disclosure of the present invention.

It should be noted that all the drawings are not intended to limit the present invention. Various modification and variations can be made without departing from the spirit of the present invention. Further, terms, such as "upper", "lower", "first", "second" and "one" etc., are merely for illustrative purpose and should not be construed to limit the scope of the present invention.

FIGS. 2A-2F are cross-sectional views illustrating a method for fabricating a package structure 2 in accordance with a first embodiment of the present invention. The package structure 2 is capable of generating electromagnetic waves, and is a radio frequency (RF) module, for example.

Figure 1A:
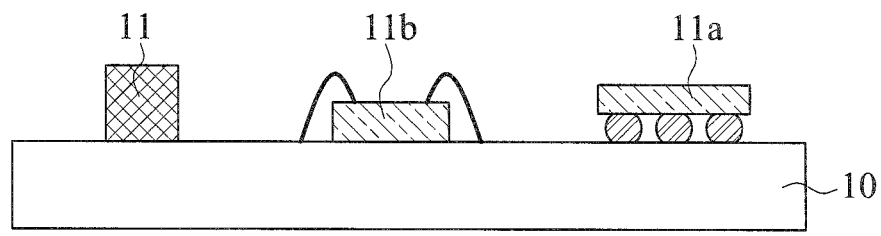
FIGS. 1A-1C are cross-sectional views illustrating a method for fabricating an encapsulating layer of a conventional RF module.
Figure 1B:
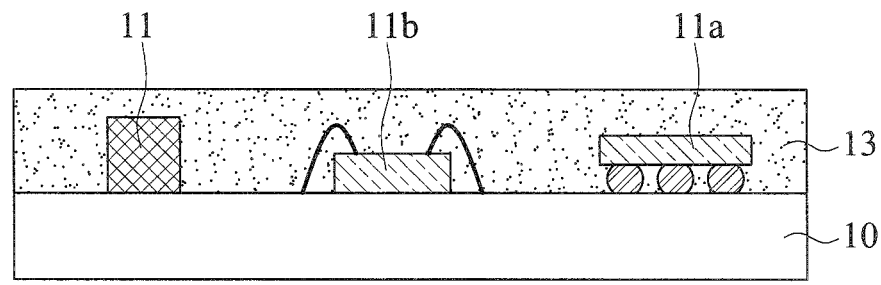
Figure 1C:
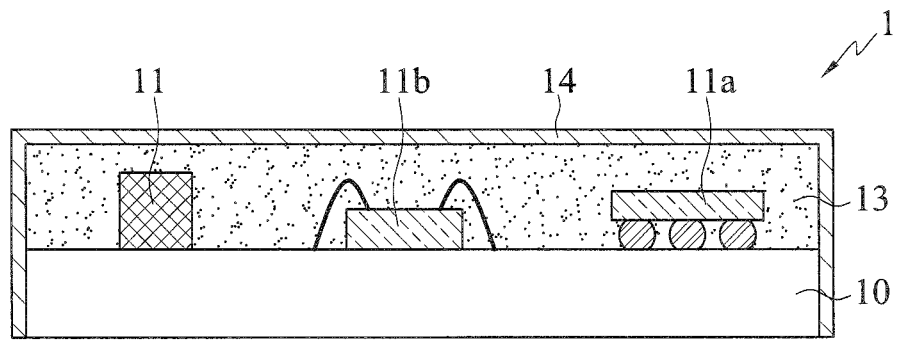
Figure 2A:
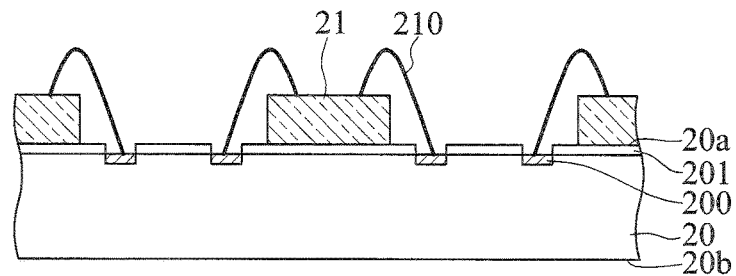
FIGS. 2A-2F are cross-sectional views illustrating a method for fabricating a package structure in accordance with a first embodiment of the present invention, wherein FIG. 2D' is another embodiment of FIG. 2D, and FIG. 2F' is another embodiment of FIG. 2F.

As shown in FIG. 2A, a carrier 20 having an upper surface 20a and a lower surface 20b is provided, and a plurality of electronic components 21 are disposed on the upper surface 20a of the carrier 20.

A circuit layer and an insulative protection layer 201 are formed on the upper surface 20a of the carrier 20. The circuit layer includes a plurality of electrical connection pads 200 that are exposed from the insulative protection layer 201. In an embodiment, the carrier 20 is in a variety of types, and includes a dielectric layer (not show), a grounding part (not shown) and an inner circuit (not shown) formed inside the carrier 20, and the inner circuit can be selectively electrically connected with the electrical connection pads 200. The carrier 20 has no specific limitation.

In an embodiment, the electronic components 21 are RF chips or other types of semiconductor chips, such as Bluetooth chips or Wireless Fidelity (Wi-Fi) chips. In an embodiment, the electronic components 21 are Bluetooth chips or Wi-Fi chips, and other electronic components (not shown) that do not cause electromagnetic interferences can be disposed on the upper surface 20a of the carrier 20.

In an embodiment, the electronic components 21 are wire bonding chips, and are electrically connected with the corresponding electrical connection pads 200a of the carrier 20 using a plurality of bonding wires 210.

Figure 2B:
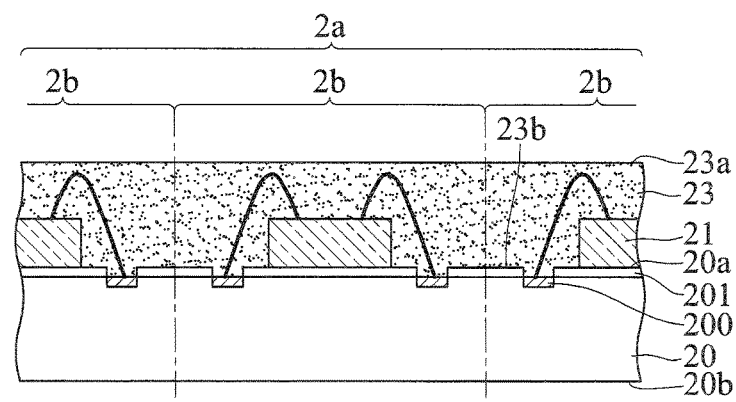

As shown in FIG. 2B, an encapsulant 23 is formed on the upper surface 20a of the carrier 20 for encapsulating the electronic components 21, so as to form a package body 2a.

In an embodiment, the encapsulant layer 23 is an encapsulating adhesive having opposing first surface 23a and second surface 23b, and coupled to the upper surface 20a of the carrier 20 via the second surface 23b of the encapsulant 23.

In an embodiment, the electronic components 21 are not exposed from the first surface 23a of the encapsulant 23.

In an embodiment, the package body 2a is defined with a plurality of package unit 2b, and each of the package units 2b has at least one of the electronic components 21.

Figure 2C:
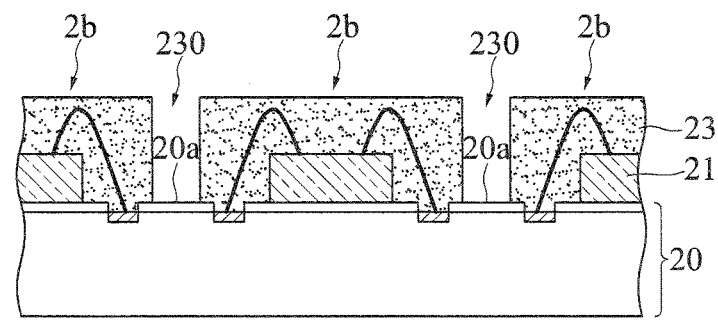

As shown in FIG. 2C, a plurality of trenches 230 are formed among of the package units 2b, allowing a portion of the upper surface 20a of the carrier 20 to be exposed from the trenches 230.

In an embodiment, the trenches 230 penetrate the encapsulant 23b, without extending into the carrier 20.

Figure 2D:
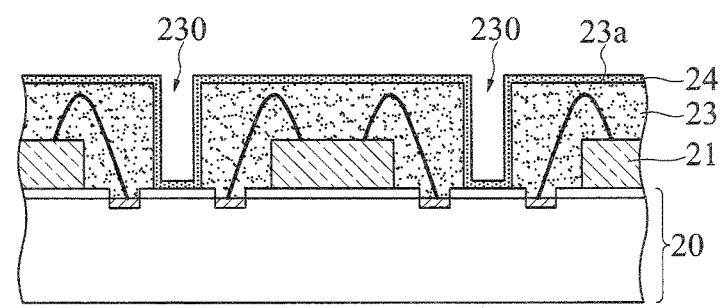
Figure 2D:
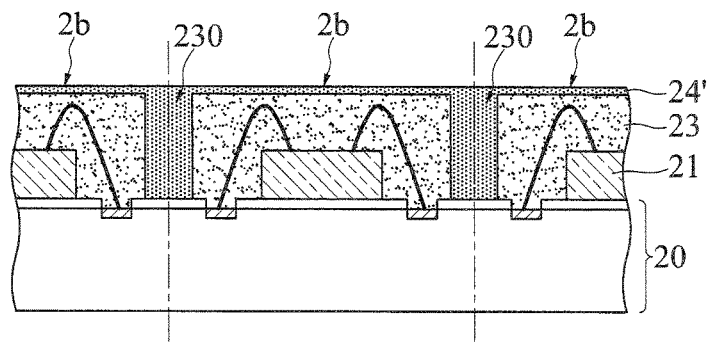

As shown in FIG. 2D, a first shielding layer 24 is formed on the first surface 23a of the encapsulant 23.

In an embodiment, the first shielding layer 24 is formed along the surface of encapsulant 23 inside the trenches 230.

In another embodiment, as shown in FIG. 2D', the trenches 230 are filled with the first shielding layer 24'.

In an embodiment, the first shielding layer 24 is made of an insulative material or a conductive material, and the first shielding layer 24 and the encapsulant layer 23 are made of different materials.

Figure 2E:
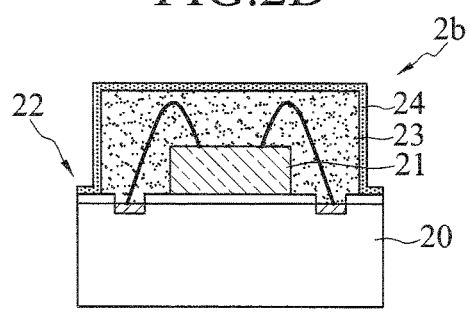

As shown in FIG. 2E, the package units 2b are singulated out along the trenches 230 in a singulation process, and the first shielding layer 24 is remained on the package units 2b.

In an embodiment, the carrier 20 has a step-like periphery 22 that is constituted by the encapsulant 23, and the first shielding layer 24 has a step-like portion corresponding to the step-like periphery 22.

Figure 2F:
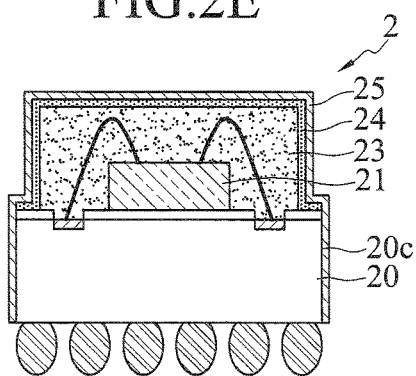
Figure 2F:
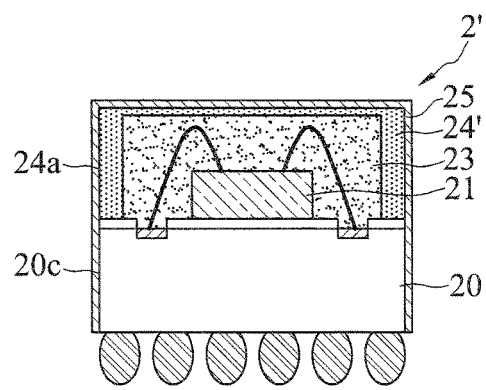

As shown in FIG. 2F, a second shielding layer 25 is formed on the first shielding layer 24 and a side surface 20c of the carrier 20, to form the package structure 2. In an embodiment, the first shielding layer 24 and the second shielding layer 25 are made of different materials.

In an embodiment, the second shielding layer 25 is made of a conductive material, and is formed by a chemical plating method, such as sputtering and coating processes.

In an embodiment, the second shielding layer 25 is made of copper (Cu), nickel (Ni), iron (Fe), aluminum (Al), etc.

In an embodiment, the second shielding layer 25 is selectively electrically connected to the grounding part of the carrier 20 (since the grounding part is exposed from the side surface 20c of the carrier 20).

In an embodiment, a package structure 2 as shown in FIG. 2F is formed after the process illustrated in FIG. 2D', and the side surface 24a of the first shielding layer 24' is flush with the side surface 20c of the carrier 20.

Figure 3A:
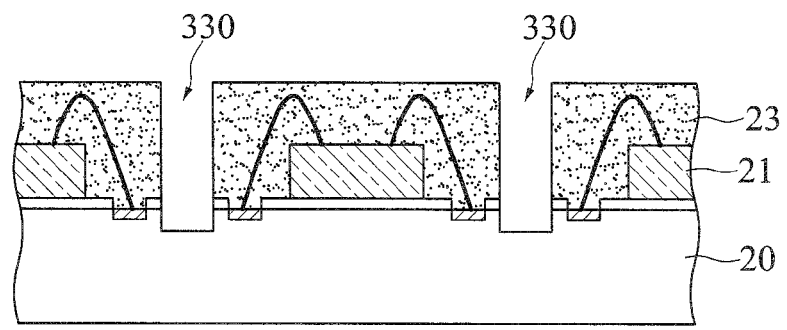
FIGS. 3A and 3B are cross-sectional views illustrating a method for fabricating a package structure in accordance with a second embodiment of the present invention, wherein FIG. 3B' is another embodiment of FIG. 3B.
Figure 3B:
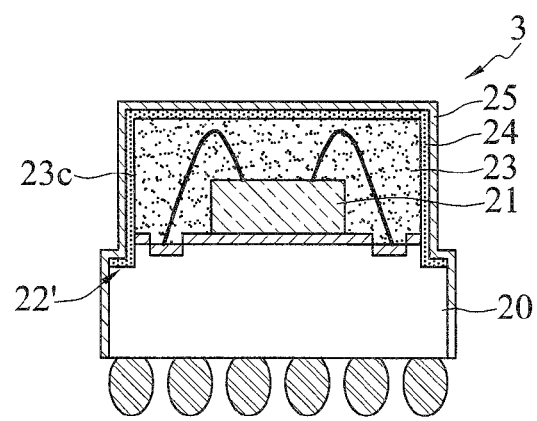
Figure 3B:
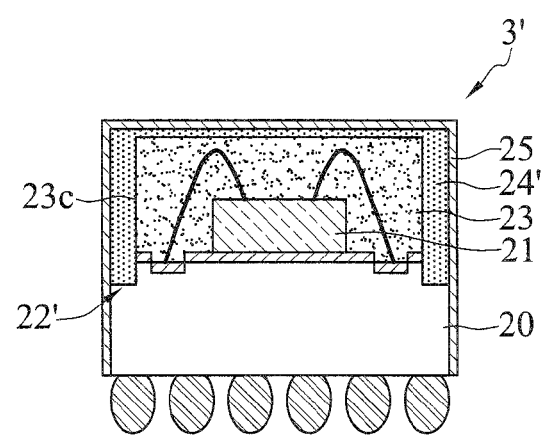

FIGS. 3A and 3B are cross-sectional views illustrating a method for fabricating a package structure in accordance with a second embodiment of the present invention, wherein FIG. 3B' is another embodiment of FIG. 3B. The second embodiment differs from the first embodiment in the depth of the trenches.

As shown in FIG. 3A, a plurality of trenches 330 are formed among the package units 2b, penetrate the encapsulant 23, and extend into the carrier 20.

As shown in FIGS. 3B and 3B' and FIGS. 2D to 2F, a method for fabricating the package structure 3, 3' of another embodiment is illustrated.

In an embodiment, the carrier 20 has a step-like periphery 22', and the encapsulant 23 is not formed on the step-like periphery 22' of the carrier 20, allowing the step-like periphery 22' of the carrier 20 to be exposed from the side surface 23c of the encapsulant 23.

Figure 4A:
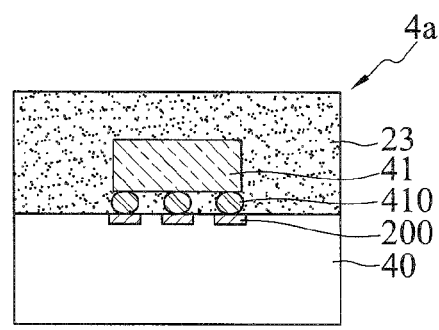
FIGS. 4A and 4B are cross-sectional views illustrating a method for fabricating a package structure in accordance with a third embodiment of the present invention.
Figure 4B:
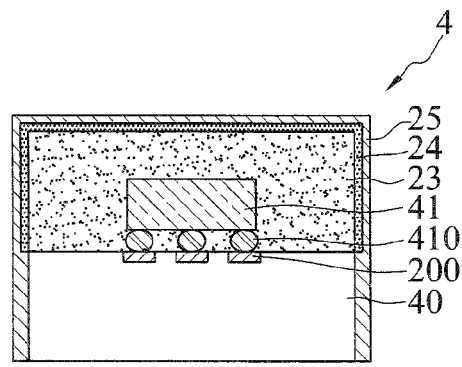

FIGS. 4A and 4B are cross-sectional views illustrating a method for fabricating a package structure in accordance with a third embodiment of the present invention. The third embodiment differs from the first and second embodiments in that the trenches are not formed in the third embodiment.

As shown in FIG. 4A, a package body 4a is formed that has a carrier 40, an electronic component 41 disposed on the carrier 40, and an encapsulant 23 that encapsulates the electronic component 41.

In an embodiment, the electronic component 41 is a flip-chip, and is electrically connected to the corresponding electrical connection pads 200 of the carrier 40 via a plurality of solder balls 410.

As shown in FIG. 4B, a first shielding layer 24 is formed on the encapsulating layer 23, and a second shielding layer 25 is formed on the first shielding layer 24.

In an embodiment, the side surface 40c of the carrier 40 is flush with the side surface 23c of the encapsulant 23, and the periphery of the carrier 40 does not exceed the side surface 23c of the encapsulant 23.

Figure 5:
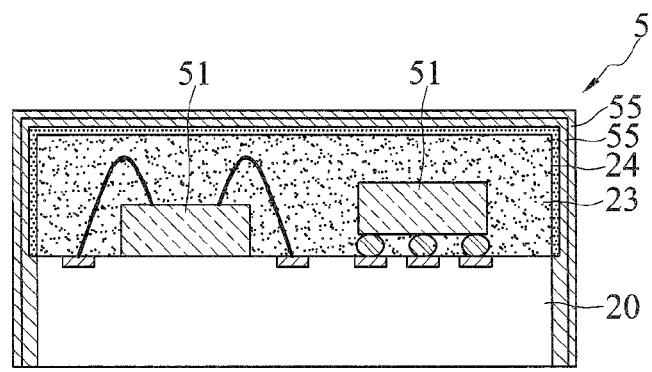
FIG. 5 is a cross-sectional view illustrating a method for fabricating a package structure in accordance with a fourth embodiment of the present invention.

FIG. 5 is a cross-sectional view illustrating a method for fabricating a package structure in accordance with a fourth embodiment of the present invention. The fourth embodiment differs from the first to third embodiments in that the numbers of the electronic components and the second shielding layers.

As shown in FIG. 5, the package structure 5 has a plurality of electronic components 51 and a plurality of second shielding layers 55.

In an embodiment, the second shielding layers 55 are made of different materials, and the adjacent second shielding layers 55 are made of different materials.

With the first shielding layers 24 and 24' and the second shielding layer 25 and 55 formed on the encapsulant 23 to function as an EMI shielding component, the electronic components 21, 41, and 51a are protected from electromagnetic interferences from, for example, a Bluetooth chip.

Furthermore, if the electronic components 21, 41 and 51 are low frequency components, multiple shielding layers provide a better protection result from electromagnetic interferences.

A package structure 2, 2', 3, 3', 4, 5 further comprises: a carrier 20, 40, at least one electronic component 21, 41, 51, an encapsulant 23, a first shielding layer 24, 24', and at least one second shielding layer 25, 55.

The package structure 2, 2', 3, 3', 4, 5 is an RF module.

The carrier 20, 40 has a plurality of electrical connection pads 200.

The electronic components 21, 41, 51 are disposed on the carrier 20, 40 and are electrically connected with the electrical connection pads 200. In an embodiment, the electronic component 21, 41, 51 is an RF chip, such as a Bluetooth chip or a Wi-Fi chip.

The encapsulant 23 is formed on the carrier 20, 40 and encapsulates the electronic components 21, 41, 51.

The first shielding layer 24, 24' is formed on the encapsulant 23, and is made of an insulative material.

The second shielding layer 25, 55 is formed on the first shielding layer 24, 24', and the second shielding layer 25, 55 and the first shielding layer 24, 24' are made of different materials. In an embodiment, the second shielding layer 25, 55 is made of a conductive material.

In an embodiment, the first shielding layer 25, 55 is further formed on the carrier 20, 40.

In an embodiment, the carrier 20, 40 has a step-like periphery 22, 22'. Hence, the first shielding layer 24 covers the step-like periphery 22, 22', and the first shielding layer 24 has a step-like portion corresponding to the step-like periphery 22, 22'.

The first shielding layer 24' covers the step-like periphery, and the side surface 24a of the first shielding layer 24' is flush with the side surface 20c of the carrier 20.

In summary, the package structure and a method for fabricating the same feature in forming multiple shielding layers on the encapsulating layer, so as to protect the electronic components from electromagnetic interferences.

Moreover, if the electronic component is a low frequency component, multiple shielding layers can provide a better protection result against electromagnetic interferences.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

The invention claimed is:

1. A package structure, comprising:
   a carrier;
   at least one electronic component disposed on the carrier;
   an encapsulant formed on the carrier for encapsulating the electronic component;
   a first shielding layer formed on and in direct contact with the encapsulant and free from being in contact with a side surface of the carrier; and
   at least one second shielding layer formed on the first shielding layer and free from being in contact with the encapsulant, the at least one second shielding layer being formed on and in direct contact with the side surface of the carrier,
   wherein the first shielding layer and the at least one second shielding layer are made of different materials.

2. The package structure of claim 1, wherein the electronic component is a radio frequency chip.

3. The package structure of claim 1, wherein the first shielding layer is made of an insulative material or a conductive material.

4. The package structure of claim 1, wherein the at least one second shielding layer is made of a conductive material.

5. The package structure of claim 1, wherein the first shielding layer is further formed on a top surface of the carrier.

6. The package structure of claim 1, wherein the carrier has a step-like periphery.

7. The package structure of claim 6, wherein the first shielding layer further covers the step-like periphery, the first shielding layer has a step-like portion corresponding to the step-like periphery, and the second shielding layer covers the side surface of the carrier.

8. The package structure of claim 6, wherein the first shielding layer covers the step-like periphery, the first shielding layer has a side surface flush with the side surface of the carrier, and the second shielding layer covers the side surface of the carrier.

* * * * *